United States Patent
Sachdev et al.

(10) Patent No.: US 8,022,679 B2
(45) Date of Patent: Sep. 20, 2011

(54) SYSTEMS AND METHODS FOR FAST SWITCH TURN ON APPROXIMATING IDEAL DIODE FUNCTION

(75) Inventors: Pinkesh Sachdev, Santa Clara, CA (US); Christopher Umminger, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 398 days.

(21) Appl. No.: 12/425,015

(22) Filed: Apr. 16, 2009

(65) Prior Publication Data
US 2009/0261798 A1 Oct. 22, 2009

Related U.S. Application Data

(60) Provisional application No. 61/124,653, filed on Apr. 18, 2008.

(51) Int. Cl.
*G05F 1/613* (2006.01)
(52) U.S. Cl. ....................................................... 323/223
(58) Field of Classification Search .......... 323/223–225, 323/268, 271, 282, 285, 288; 363/59, 60
See application file for complete search history.

(56) References Cited

U.S. PATENT DOCUMENTS 5,841,725 A * 11/1998 Kang et al. ..................... 365/226
6,404,273 B1 * 6/2002 Gregori et al. ................ 327/536

OTHER PUBLICATIONS

Positive High Voltage Ideal Diode-OR with Input Supply and Fuse Monitors, LTC4355, Linear Technology, 1-18, 2007.
MOSFET Diode-OR Controller, LT4351, Linear Technology, 1-20, 2003.
ORing MOSFET Controller with Ultra-Fast 200ns Turn-Off, MAX5079, 1-18, 2005.
Full Featured N+1 and ORing Power Rail Controller, TPS2410, TPS2411, Texas Instruments, 1-26, Feb. 2007.

* cited by examiner

*Primary Examiner* — Matthew Nguyen
(74) *Attorney, Agent, or Firm* — McDermott Will & Emery LLP

(57) ABSTRACT

A switching circuit approximating the fast switching characteristics and small forward voltage drop of an ideal diode is provided. The switching circuit may include a voltage multiplier circuit, a reservoir capacitor and a pull up switch configured to be coupled to the control terminal of a semiconductor switch.

33 Claims, 3 Drawing Sheets

SYSTEMS AND METHODS FOR FAST SWITCH TURN ON APPROXIMATING IDEAL DIODE FUNCTION

PRIORITY CLAIM

This application claims priority pursuant to 35 U.S.C. §119 to U.S. Provisional Application Ser. No. 61/124,653 filed Apr. 18, 2008.

FIELD OF INVENTION

The present invention generally relates to switching circuits, and more particularly, to circuits and methods that provide for the fast turn ON and turn OFF of switching devices such that the turn ON and turn OFF characteristics of the switching device approximates those of an ideal diode.

BACKGROUND

Semiconductor diodes are well known in the art. Generally speaking, a diode functions as an electrical valve allowing current to flow in a forward direction from its anode to its cathode, with a known voltage drop associated with its p-n junction. When current is applied in the opposite direction, however, the diode acts as an open circuit, preventing current flow in that direction. In many applications, such as power applications, it is desirable to reduce or minimize the forward voltage drop of the diode to reduce or minimize its power dissipation. A diode having a 700 mV forward voltage drop, for example, will dissipate 7 watts of power when it conducts 10 amps of current, which is unsuitable for many applications.

Accordingly, this power dissipation problem has motivated circuit designers to design switching circuits having as small a forward voltage drop as possible in an attempt to produce an "ideal diode" circuit (i.e., one which turns ON substantially instantaneously with substantially no forward voltage drop).

Such circuits generally include a semiconductor switch as a pass element (such as MOSFETs) that has a small forward voltage drop (typically under 100 mV) and thus significantly reduce power dissipation. One drawback of these circuits is the relatively long turn ON time associated with the switches as compared to conventional diodes. For example, a switch-based ideal diode circuit may have a turn ON time of 50 microseconds whereas a conventional diode may turn ON in picoseconds. This lag in turn ON time may be unsuitable for applications that require strict load regulation or fast response times.

One example of a semiconductor based ideal diode circuit is the LTC4355 produced by Linear Technology Corporation of Milpitas Calif., the assignee of this patent application. The LTC4355 employs a charge pump circuit to generate a voltage of sufficient magnitude to drive the gate of a MOSFET switch. The low output current of the charge pump, however, causes a relatively slow turn ON of the MOSFET, which is not optimal for low voltage applications.

Another ideal diode circuit is the LT4351 device, produced by Linear Technology, which relies on an external supply or a boost regulator for the gate drive. The use of a boost regulator requires an inductor, which occupies significant board area and generates noise due to its relatively large and fast switching currents, which may cause gate node chatter, disturbing load voltage.

Similarly, the MAX5079 device from Maxim Integrated Products uses a charge pump and an external flying capacitor to deliver 2 mA (for a 100 nF flying capacitor) of switch pull up current to drive a switch gate, providing a 25 microsecond switching time, which is too slow for some ideal diode applications. With this approach, increasing the size of the flying capacitor to improve drive current tends to cause excessive ripple at the input, degrading circuit performance. The TPS2410 ideal diode device produced by Texas Instruments suffers from similar drawbacks.

SUMMARY

A switching circuit approximating the fast switching characteristics and small forward voltage drop of an ideal diode is provided. The switching circuit may include an input node for receiving an input voltage, a voltage multiplier circuit such as a charge pump having an input and output; a charge storage device such as a reservoir capacitor coupled to the output of the voltage multiplier circuit; and a semiconductor switching element having a control terminal, the control terminal being selectively coupled to the output of the voltage multiplier circuit and the charge storage device, such that when the control terminal of the switching element is coupled to the voltage multiplier circuit and the charge storage device during a switching interval, a charge stored on the charge storage device is redistributed to the control terminal of the switching element, thereby applying a substantially constant drive voltage to the control terminal, resulting in a substantially immediate turn ON of the switching element.

BRIEF DESCRIPTION OF THE DRAWINGS

The invention is illustrated in the figures of the accompanying drawings which are meant to be exemplary and not limiting, in which like references are intended to refer to like or corresponding parts, and in which.

DETAILED DESCRIPTION

Figure 1:
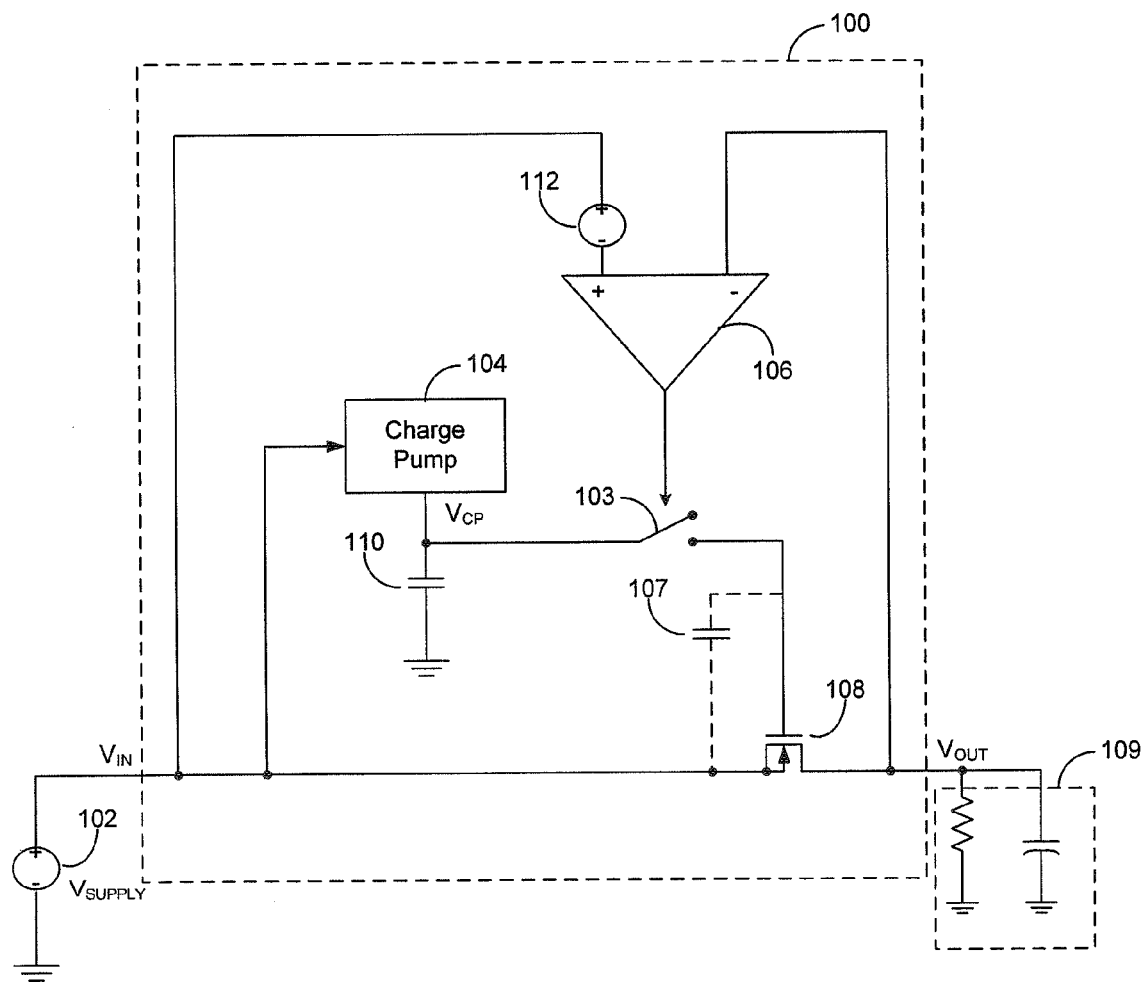
FIG. 1 is a schematic diagram illustrating selected portions of a fast switching circuit constructed in accordance with the principles of the present invention that approximates the switching characteristics of an ideal diode.

A switching circuit 100, which may function as an ideal diode, constructed in accordance with the principles of the present invention, is shown in FIG. 1. As shown, circuit 100 may include a gate pull up switch 103, a charge pump circuit 104, a comparator circuit 106, an NMOS MOSFET switch 108, a reservoir capacitor 110 and a voltage reference 112. Pull up switch 103 may be any suitable semiconductor or armature type switch.

Charge pump 104 may be constructed as a low power version of the charge pumps described in U.S. Pat. No. 6,411,531, which is hereby incorporated by reference in its entirety, or may be of any suitable conventional design. MOSFET 108 may be any suitable semiconductor switching element, such as an NMOS or NPN configuration and preferably includes fast switching characteristics and an appropriate power rating. As shown, NMOS 108 has an intrinsic gate to source capacitance 107. Furthermore, circuit 100 may be coupled to a load which is generally depicted as resistor-capacitor ("RC") network 109 in FIG. 1, and to an input voltage source 102 ($V_{SUPPLY}$).

Some embodiments of the invention may be constructed as an integrated circuit. In such embodiments, many of the components described above may be disposed on a semiconductor die. For example, comparator 106, reference 112, and switch 103 may be disposed on a semiconductor die. Moreover, because the circuit 100 operating as ideal diode is typically turned ON and OFF intermittently, charge pump 104 and its associated capacitors may be constructed such that they are small enough to be disposed on a semiconductor die. Reservoir capacitor 110 and NMOS 108, however, may be external components. In certain embodiments, such as low power embodiments, NMOS 108 and/or capacitor 110 may be disposed on an integrated circuit in addition to the other components described above.

One way in which switching circuit 100 has been improved as compared to conventional ideal diode systems is by the addition of reservoir capacitor 110. Capacitor 110 is typically selected to be significantly larger than the value of intrinsic capacitance 107 associated with NMOS 108. As described in more detail below, this is generally desirable because it allows capacitor 110 to share its accumulated charge with capacitance 107 during switching intervals, providing a substantially constant, but slightly reduced drive voltage to the gate of NMOS 108 on a near-instantaneous basis during transition periods, thereby achieving the desired fast turn ON characteristic.

More particularly, circuit 100 may operate as follows. Assume an input voltage $V_{IN}$ of 3 volts is provided to switching circuit 100 by supply 102. This input voltage is provided (directly or indirectly) to the input of a voltage multiplier, such as charge pump 104, which may increase its value by a certain multiplication factor (e.g., by a factor of 2 to produce 6 volts). This increased voltage is provided to reservoir capacitor 110 which is charged to that value. The initial charging of capacitor 110 to the increased voltage produced by charge pump 104 generally occurs during an initialization period or during power-up.

As shown in FIG. 1, the input voltage provided by source 102 is also coupled to reference voltage 112 ($V_{TH}$) which is, in turn, coupled to the non-inverting terminal of comparator 106. This establishes a low voltage turn ON threshold ($V_{LTO}$) at the non-inverting terminal of comparator 106 which is substantially equal to $V_{IN}$-$V_{TH}$. The inverting terminal of comparator 106 is coupled to drain of NMOS 108.

Thus, when a voltage from source 102 is initially applied to switching circuit 100 during power-up, NMOS 108 is OFF (i.e., in a non-conducting state) and pull up switch 103 is open. As voltage appears at the non-inverting terminal of comparator 106, it trips, generating a logic high at its output, causing pull up switch 103 to close, which allows voltage from charge pump 104 and capacitor 110 to be provided to the gate of NMOS 108, turning it ON. As a result, power flows from source 102 to load 109 through NMOS 108 generating an output voltage $V_{OUT}$. During this initial power up period, NMOS 108 is turned ON relatively slowly, as charge pump 104 begins to produce a current sufficient to generate a turn ON voltage for NMOS 108.

Figure 2:
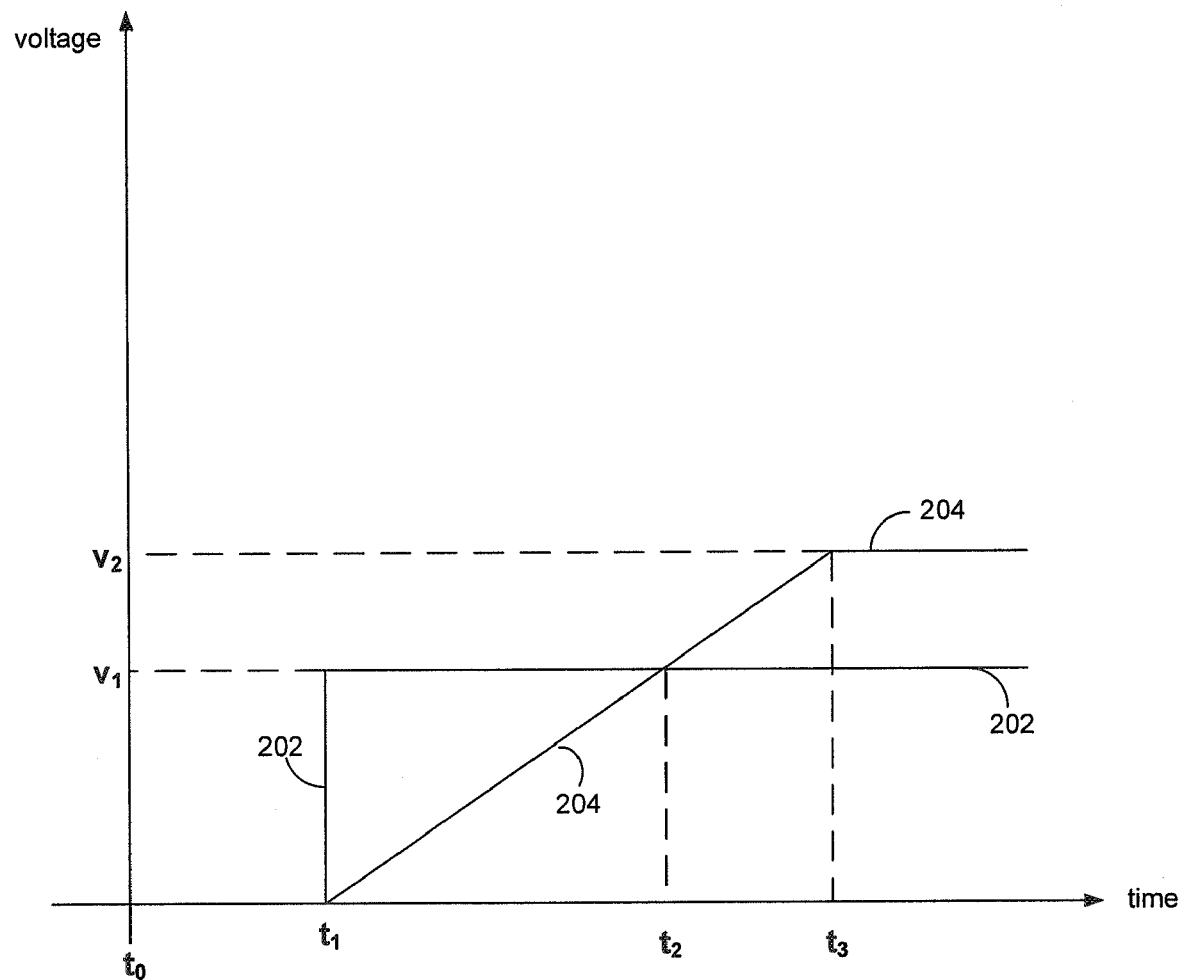
FIG. 2 is a graph illustrating the output voltage of a charge pump circuit compared to its input voltage during the initialization of the switching circuit shown in FIG. 1.

The operation of circuit 100 may be better understood by considering graph 200 shown in FIG. 2 which illustrates the output of charge pump 104, (as line 204) as compared to the input voltage provided by source 102 (step waveform 202) during initialization. As shown, a step waveform 202 having a magnitude $V_1$ may be applied to the input of switching circuit 100 at time $t_1$. This causes charge pump 104 to begin to generate the ramping waveform illustrated by line 204. As can be seen, at time $t_1$ charge pump 104 begins to generate a voltage signal increasing in magnitude, which at time $t_2$ substantially equals the input voltage $V_1$. The output of charge pump 104 continues to rise until it reaches its maximum output voltage level $V_2$ at time $t_3$, and then levels off.

After initialization, NMOS 108 remains ON, and conducts power from source 102 to load 109. During this period, reservoir capacitor 110 is charged to the boosted voltage level produced by charge pump 104 (e.g., to $V_2$). In some embodiments, reservoir capacitor 110 may be coupled to $V_{IN}$ to reduce charging time. Comparator 106 monitors the output voltage of circuit 100 at the drain of NMOS 108 for changes in output voltage. When the output voltage rises above the low voltage turn ON threshold ($V_{LTO}$), comparator 106 resets and generates a logic low at its output, which causes pull up switch 103 to open. Other ideal diode circuitry such as a forward drop servo amplifier and/or a reverse comparator (both not shown) may be used to maintain the gate of NMOS 108 at a logic high or turn it OFF in response to input or load voltage changes. Fast turn OFF of NMOS 108 may be achieved by coupling its control terminal to known low potential such as ground or the input voltage using the reverse comparator (not shown). When NMOS 108 is OFF, the output voltage of circuit 100 may be maintained by capacitive portion of load 109 or other external circuitry (not shown).

Comparator 106 continues to monitor the output voltage of circuit 100. When this voltage decays or otherwise drops below the low voltage threshold established by voltage source 102 and reference 112, comparator 106 trips again, causing pull up switch 103 to turn ON, connecting charge pump 104 and capacitor 110 to the gate of NMOS 108, turning it ON.

In contrast to the initialization operation described above, however, reservoir capacitor 110 is now fully charged, so that when capacitor 110 is coupled to the gate of NMOS 108, charge may flow from capacitor 110 to intrinsic capacitance 107 allowing the output voltage of charge pump 104 to remain substantially constant (or with a small voltage drop as further described herein) during the switch transition.

One advantage of this arrangement is that the gate of NMOS 108 is driven to the boosted voltage level produced by charge pump 104 nearly immediately after pull up switch 103 closes, substantially reducing, or virtually eliminating turn ON delays associated with intrinsic capacitance 107. Moreover, in cases where the output voltage of charge pump 104 is selected such that it is large enough to ensure NMOS 108 is turned ON substantially fully, the present invention provides a way to turn NMOS 108 ON substantially immediately, and substantially fully, when the output voltage of circuit 100 drops below the $V_{LTO}$ threshold, thus closely approximating the switching characteristics of an ideal diode.

For example, turn ON times under about 5 microseconds can be obtained, depending specific circuit implementation, with turn ON times under 1 microsecond achievable with the circuits and methods described herein.

In some embodiments of the invention, circuitry may be added to establish the slew rate or turn ON time of NMOS 108. For example, a current source may be coupled between charge pump 104 and switch 103 (not shown). With this approach, the amount of charge provided to the control terminal of NMOS 108 may be applied at a known rate. This may be desirable as it establishes a turn ON time and reduces stress on NMOS 108.

Figure 3A:
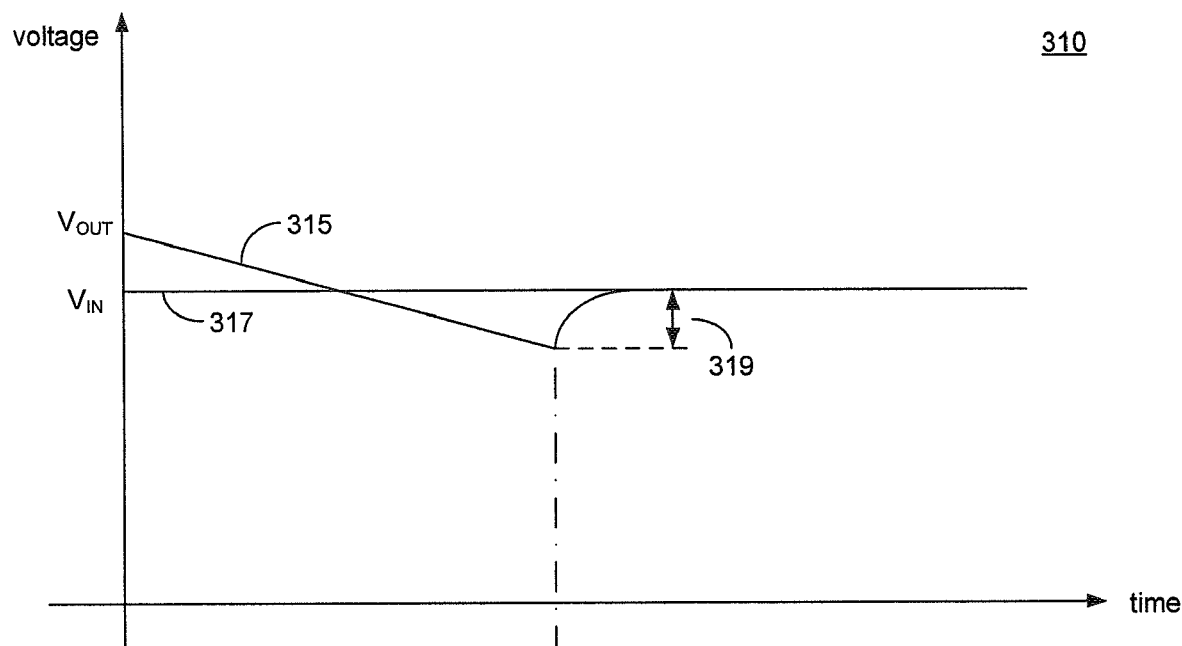
FIG. 3A is a graph illustrating the output voltage of the switching circuit in FIG. 1 as compared to its input voltage during a switch transition.
Figure 3B:
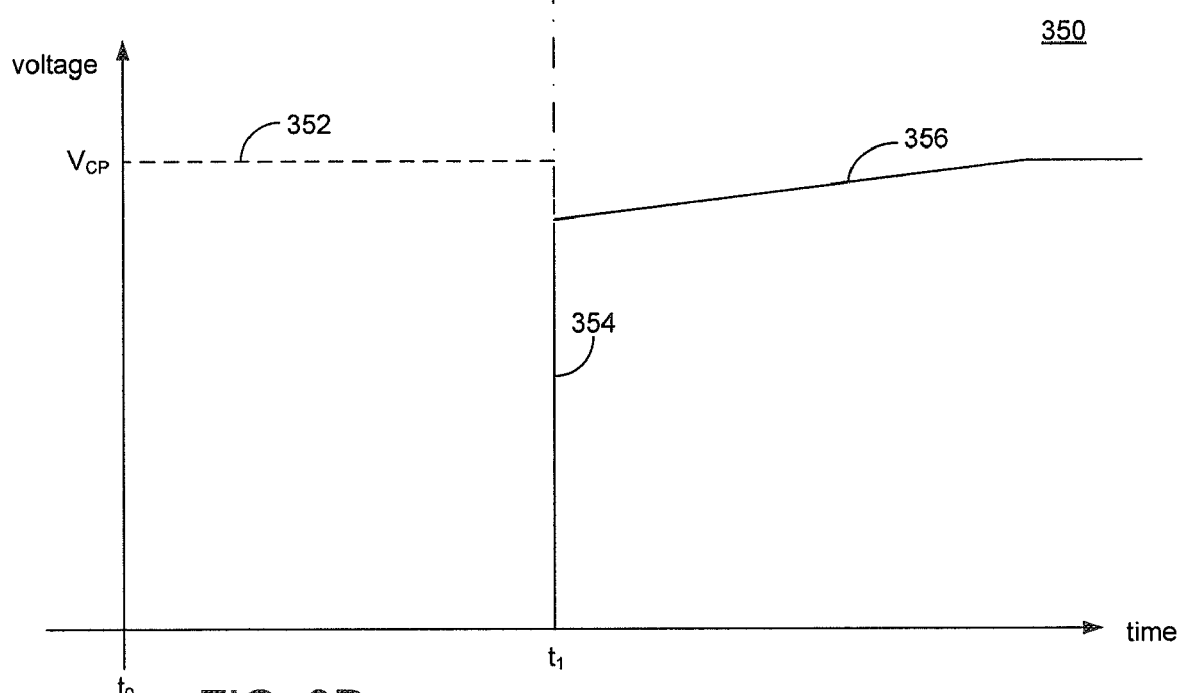
FIG. 3B is a graph illustrating the output voltage of the charge pump circuit as compared to a gate voltage of a switching element in the switching circuit of FIG. 1 during a switch transition.

The operation of switching circuit 100 may be more fully understood by considering graphs 310 and 350, shown in FIGS. 3A and 3B, respectively. Graph 310 illustrates the input voltage $V_{IN}$ as compared to the output $V_{OUT}$ at the drain of NMOS 108 during a switching interval after the initial power up is complete. In particular, line 317 represents the input voltage applied to circuit 100 and line 315 represents the output voltage.

At time $t_0$, the output voltage is greater than the input voltage, and thus pull up switch 103 is open and assume NMOS 108 OFF. Over time, the output voltage beings to decrease as illustrated by the downward slope of line 315, due to decay or changing load conditions. When the low voltage threshold 319 is reached at time $t_1$, comparator 106 trips, closing pull up switch 103 and turning NMOS 108 ON substantially fully and substantially immediately as described above. The curved portion of line 315 immediately after time $t_1$ represents the output voltage increasing back to the input voltage level and may vary somewhat in terms of slope and length depending on load conditions.

It will be understood from the foregoing that the low voltage threshold established by reference 112 may be varied by circuit designers or end users depending on the intended specific application or the desired level of performance. For example, in one embodiment of the invention, $V_{IN}$ may be set at 3 volts and reference voltage 112 may be set at 70 mV in order to obtain a relatively precise load regulation characteristic. Such an arrangement may be desirable, for example, when providing power to a voltage bus that drives a 3 volt integrated circuit application.

In such a case, the output voltage at the drain of NMOS 108 may be allowed to drop to 2.93 volts before comparator 106 trips and begins to raise the output voltage back to the 3 volt level. Nevertheless, it will be understood that any suitable low voltage threshold may be selected if desired to obtain a particular load regulation characteristic. For example, in some applications where more variation in output voltage can be tolerated, a less sensitive configuration can be used. For example, in a power application providing 12 volts, it may be desirable to set reference 112 to 100 mV, which allows the output voltage to drop to 11.9 volts before NMOS 108 is turned ON again.

Referring now to FIG. 3B, a graph 350 is shown which compares the output voltage of charge pump 104 to the voltage observed at the gate of NMOS 108 during a switch transition period. Graph 350 generally correlates to graph 310 with the switch transition occurring at time $t_1$ as indicated by the dotted line. Prior to the switch transition, charge pump 104 outputs a substantially constant boosted output voltage $V_{CP}$ as indicated by dotted line 352.

When the output voltage of switching circuit 100 drops below the low voltage threshold as described above, comparator 106 trips connecting charge pump 104 and reservoir capacitor 110 to the gate of NMOS 108. This causes a voltage step to be applied to the gate of NMOS 108 at time $t_1$ which is represented as vertical line 354. This voltage step is generated primarily by the instantaneous charge redistribution from reservoir capacitor 110 to the intrinsic capacitance 107 associated with the gate of NMOS 108.

Although this charge redistribution causes a small voltage drop in the output voltage of charge pump 104 and capacitor 110 as indicated by the sloped portion of line 356 immediately after $t_1$, the voltage produced at time $t_1$ will be large enough to fully turn ON NMOS 108 if the output voltage of charge pump 104 and the size of reservoir capacitor 110 are selected properly. Moreover, after the switch transition at time $t_1$, the voltage at the output of charge pump 104 and the gate of NMOS 108 will continue to rise until the maximum output voltage of pump 104 is reached as shown by line 356.

The value of reservoir capacitor 110 and the output voltage of charge pump 104 may be selected based on certain characteristics of NMOS 108 (and in view of each other) to ensure the desired switching characteristics are obtained from circuit 100. For example, NMOS 108 may require 2 volts at its gate to source to turn ON fully. Accordingly, it may be desirable to have charge pump 104 generate a voltage somewhat higher than this required turn ON value in order to account for the voltage drop experienced during the switch transition to ensure a fast and full turn ON. Thus, in this case, it may be desirable to have charge pump develop a voltage twice the required magnitude (i.e., 6 volts) in order to ensure a full turn ON.

Similarly, the value of reservoir capacitor 110 may be chosen in view of intrinsic capacitance 107 in addition to any parasitic capacitance associated with the connection of charge pump 104 and capacitor 110 to the gate of NMOS 108, to ensure the desired drive voltage is applied to the gate of NMOS 108 during a switch transition period. For example, in some embodiments, reservoir capacitor 110 may be selected to be 10 times greater in size than the intrinsic and parasitic capacitance associated with the gate of NMOS 108.

In this case, the voltage drop during a switch transition may be proportional to the capacitance ratio of 10:1. Thus, in the example above, if 6 volts is stored on reservoir capacitor 110, at the instant pull up switch 103 closes (at $t_1$), a near instantaneous voltage of 5.7 volts is applied to the gate of NMOS 108. In other embodiments of the same example, where the ratio is 100:1, the voltage drop may be below 1%, and where the ratio is 2:1, the voltage drop may be about 17%, etc.

Moreover, it will be understood from the above that the size of reservoir capacitor 110 may be determined based on the turn ON characteristics of NMOS 108, such that it is turned ON to a desired degree or within certain desired operating parameters. For example, in some embodiments, the value of reservoir capacitor 110 may be substantially "matched" with the charge pump output voltage and turn ON parameters of NMOS 108 such that the charge stored in capacitor 110 is sufficient to turn fully ON NMOS 108 (or ON to the degree desired), in view of associated parasitic and intrinsic capacitances, without exposing its gate to unnecessary stress associated with excessive voltage. This may involve, for example, providing the substantially minimum voltage required to turn NMOS 108 fully ON to its gate during a switch transition.

In some embodiments of the invention, the fast turn ON of NMOS 103 may cause oscillation or transient "ringing" on the input or output voltages due to parasitic inductances associated with the power supply. Other circuits and methods may be used for addressing this problem such as those described in commonly owned co-pending application entitled "Systems and Methods for Oscillation Suppression in Switching Circuits" which is filed on even date herewith and which is hereby incorporated by reference in its entirety.

It will be appreciated that the circuits and methods described herein have broad based applicability to virtually all circuit applications implementing an ideal diode function. Such applications may include, but are not limited to, redundant power supplies, hot swap voltage controllers, load share controllers, power path controllers, low voltage power supplies and regulators, telecommunications systems, etc.

Detailed embodiments of the present invention are disclosed herein, however, it is to be understood that the disclosed embodiments are merely exemplary of the invention, which may be embodied in various forms and can be practiced by other than the described embodiments. Therefore, specific functional details disclosed herein are not to be interpreted as limiting, but merely as a basis for supporting the claims and as a representative basis for teaching one skilled in the art to variously employ the present invention in virtually any appropriately detailed embodiment.

What is claimed is:

1. A switching circuit having a reduced turn ON time comprising:
    an input node for receiving an input voltage,
    a voltage multiplier circuit for producing an increased voltage based on the input voltage, the voltage multiplier having an input and output;
    a charge storage device coupled to the output of the voltage multiplier circuit; and
    a semiconductor switching element having a control terminal, the control terminal being selectively coupled to the output of the voltage multiplier circuit and the charge storage device, such that when the control terminal of the switching element is coupled to the voltage multiplier circuit and the charge storage device during a switching interval, a charge stored on the charge storage device is redistributed to the control terminal of the switching element, thereby applying a substantially constant drive voltage to the control terminal, resulting in a substantially immediate turn ON of the semiconductor switching element.

2. The switching circuit of claim 1 wherein a capacitance of the charge storage device is significantly larger than a capacitance associated with the control terminal of the switching element.

3. The switching circuit of claim 1 wherein a capacitance of the charge storage device is selected to obtain a predetermined turn ON time for the switching element.

4. The switching circuit of claim 1 wherein the increased voltage produced by the voltage multiplier circuit is larger than a minimum voltage required to fully turn ON the switching element.

5. The switching circuit of claim 4 wherein the increased voltage produced by the voltage multiplier circuit is greater than or substantially equal to the minimum voltage required to fully turn ON the switching element plus any voltage drop associated with charge redistribution from the charge storage device to the control terminal of the switching element.

6. The switching circuit of claim 1 wherein the increased voltage produced by the voltage multiplier circuit is selected to obtain predetermined turn ON time for the switching element.

7. The switching circuit of claim 1 wherein the voltage multiplier circuit comprises a charge pump.

8. The switching circuit of claim 1 wherein the voltage multiplier circuit is disposed on an integrated circuit.

9. The switching circuit of claim 1 wherein the charge storage device comprises one or more capacitors.

10. The switching circuit of claim 1 further comprising a pull up switch coupled between the control terminal of the semiconductor switching element and the output of the voltage multiplier circuit and the charge storage device for selectively coupling the output of the voltage multiplier circuit and the charge storage device to the control terminal of the semiconductor switching element.

11. The switching circuit of claim 10 further comprising a control circuit coupled to the pull up switch that turns the pull up switch ON when a threshold level is exceeded.

12. The switching circuit of claim 11 further comprising a control circuit includes a comparator circuit.

13. An ideal diode circuit disposed on an integrated circuit device comprising:
    an input node for receiving an input voltage,
    a voltage multiplier circuit for producing an increased voltage based on the input voltage, the voltage multiplier having a plurality of capacitors; and
    a pull up switch configured to selectively couple an output of the voltage multiplier circuit to a control terminal of an external semiconductor switch such that when the control terminal of the switching element is coupled to the voltage multiplier circuit during a switching interval, a charge on the voltage multiplier circuit is redistributed to the control terminal of the switching element, thereby applying a substantially constant drive voltage to the control terminal, resulting in a substantially immediate turn ON of the external semiconductor switch.

14. The ideal diode circuit of claim 13 wherein the output of the voltage multiplier circuit is coupled to an external reservoir capacitor.

15. The ideal diode of claim 14 wherein a capacitance of the external charge storage device is significantly larger than a capacitance associated with the control terminal of the external semiconductor switch.

16. The ideal diode of claim 14 wherein a capacitance of the external charge storage device is selected to obtain a predetermined turn ON time for the external semiconductor switch.

17. The ideal diode of claim 13 wherein the increased voltage produced by the voltage multiplier circuit is larger than a minimum voltage required to fully turn ON the external semiconductor switch.

18. The ideal diode of claim 17 wherein the increased voltage produced by the voltage multiplier circuit is greater than or substantially equal to the minimum voltage required to fully turn ON the external semiconductor switch plus any voltage drop associated with charge redistribution from the charge storage device to the control terminal of the external semiconductor switch.

19. The ideal diode of claim 17 wherein the increased voltage produced by the voltage multiplier circuit is selected to obtain predetermined turn ON time for the external semiconductor switch.

20. The ideal diode of claim 13 wherein the voltage multiplier circuit comprises a charge pump.

21. The ideal diode circuit of claim 13 further comprising a control circuit coupled to the pull up switch that turns the pull up switch ON when a threshold level is exceeded.

22. The ideal diode circuit of claim 21 further comprising a control circuit includes a comparator circuit.

23. An ideal diode circuit disposed on an integrated circuit device comprising:
    an input node for receiving an input voltage,
    a voltage multiplier circuit for producing an increased voltage based on the input voltage, the voltage multiplier having a plurality of capacitors; and
    a pull up switch configured to selectively couple an output of the voltage multiplier circuit to a control terminal of a semiconductor switch such that when the control terminal of the switching element is coupled to the voltage multiplier circuit during a switching interval, a charge on the voltage multiplier circuit is redistributed to the control terminal of the switching element, thereby applying a substantially constant drive voltage to the control terminal, resulting in a substantially immediate turn ON of the semiconductor switch.

24. The ideal diode circuit of claim 23 wherein the output of the voltage multiplier circuit is coupled to an reservoir capacitor.

25. The ideal diode of claim 24 wherein a capacitance of the charge storage device is significantly larger than a capacitance associated with the control terminal of the semiconductor switch.

26. The ideal diode of claim 24 wherein a capacitance of the charge storage device is selected to obtain a predetermined turn ON time for the semiconductor switch.

27. The ideal diode of claim 23 wherein the increased voltage produced by the voltage multiplier circuit is larger than a minimum voltage required to fully turn ON the semiconductor switch.

28. The ideal diode of claim 27 wherein the increased voltage produced by the voltage multiplier circuit is greater than or substantially equal to the minimum voltage required to fully turn ON the semiconductor switch plus any voltage drop associated with charge redistribution from the charge storage device to the control terminal of the semiconductor switch.

29. The ideal diode of claim 27 wherein the increased voltage produced by the voltage multiplier circuit is selected to obtain predetermined turn ON time for the semiconductor switch.

30. The ideal diode of claim 23 wherein the voltage multiplier circuit comprises a charge pump.

31. The ideal diode circuit of claim 23 further comprising a control circuit coupled to the pull up switch that turns the pull up switch ON when a threshold level is exceeded.

32. The ideal diode circuit of claim 31 further comprising a control circuit includes a comparator circuit.

33. The circuit of claim 23 wherein the ideal diode circuit is a low power ideal diode circuit.

* * * * *